(12) United States Patent
Fehrmann et al.

(10) Patent No.: US 9,373,533 B2
(45) Date of Patent: Jun. 21, 2016

(54) SYSTEMS AND METHODS FOR PROVIDING WAFER ACCESS IN A WAFER PROCESSING SYSTEM

(71) Applicant: Cascade Microtech, Inc., Beaverton, OR (US)

(72) Inventors: Frank Fehrmann, Priestewitz OT Basslitz (DE); Botho Hirschfeld, Dresden (DE); Stojan Kanev, Thiendorf OT Sacka (DE)

(73) Assignee: Cascade Microtech, Inc., Beaverton, OR (US)

( * ) Notice: Subject to any disclaimer, the term of this patent is extended or adjusted under 35 U.S.C. 154(b) by 151 days.

(21) Appl. No.: 14/141,812

(22) Filed: Dec. 27, 2013

(65) Prior Publication Data

US 2014/0186145 A1     Jul. 3, 2014

Related U.S. Application Data

(60) Provisional application No. 61/747,703, filed on Dec. 31, 2012.

(51) Int. Cl.
*G01R 31/20* (2006.01)
*H01L 21/677* (2006.01)

(52) U.S. Cl.
CPC .... *H01L 21/67745* (2013.01); *H01L 21/67775* (2013.01)

(58) Field of Classification Search
CPC ............ H01L 21/677; H01L 21/68707; H01L 21/67727; H01L 21/6773–21/67769; Y10S 414/139; Y10S 414/135; Y10S 414/14; B65G 2201/0297; B24B 37/345; G01R 31/2887; G01R 31/2893; B25J 9/00; G05B 19/4189; G05B 2219/31078; Y02P 90/28
See application file for complete search history.

(56) References Cited

U.S. PATENT DOCUMENTS

| | | | | | |
|---|---|---|---|---|---|
| 4,789,294 | A | * | 12/1988 | Sato | ................. H01L 21/67778 414/416.03 |
| 5,278,494 | A | * | 1/1994 | Obigane | ........... H01L 21/67778 324/750.19 |
| 5,672,239 | A | | 9/1997 | DeOrnellas | |
| 5,690,467 | A | * | 11/1997 | Smith | .................... G01R 31/01 414/795.2 |
| 5,801,527 | A | * | 9/1998 | Ishii | ....................... G01R 31/01 324/750.22 |
| 6,202,318 | B1 | | 3/2001 | Guldi et al. | |
| 2003/0198541 | A1 | | 10/2003 | Davis et al. | |
| 2005/0012515 | A1 | | 1/2005 | Kim | |

(Continued)

*Primary Examiner* — Minh N Tang
(74) *Attorney, Agent, or Firm* — Dascenzo Intellectual Property Law, P.C.

(57) ABSTRACT

Systems and methods for providing wafer access in a wafer processing system are disclosed herein. The methods may include docking a first wafer cassette on the wafer processing system and removing a selected wafer from the first wafer cassette with the wafer processing system. The methods further may include performing a process operation on the selected wafer with the wafer processing system and undocking the first wafer cassette from the wafer processing system while performing the process operation. The methods also may include docking a second wafer cassette (which may be the same as or different from the first wafer cassette) on the wafer processing system, inventorying the second wafer cassette with the wafer processing system, and/or subsequently placing the selected wafer in the second wafer cassette. The systems may include wafer processing systems that include a controller that is programmed to perform at least a portion of the methods.

20 Claims, 3 Drawing Sheets

(56) References Cited

U.S. PATENT DOCUMENTS

2006/0066293 A1* 3/2006 Gopal ............... G01R 31/2867
 324/750.14
2007/0045536 A1* 3/2007 Nakasuji ............. G01N 23/225
 250/310
2009/0212803 A1* 8/2009 Yamamoto ......... G01R 31/2893
 324/762.06

* cited by examiner

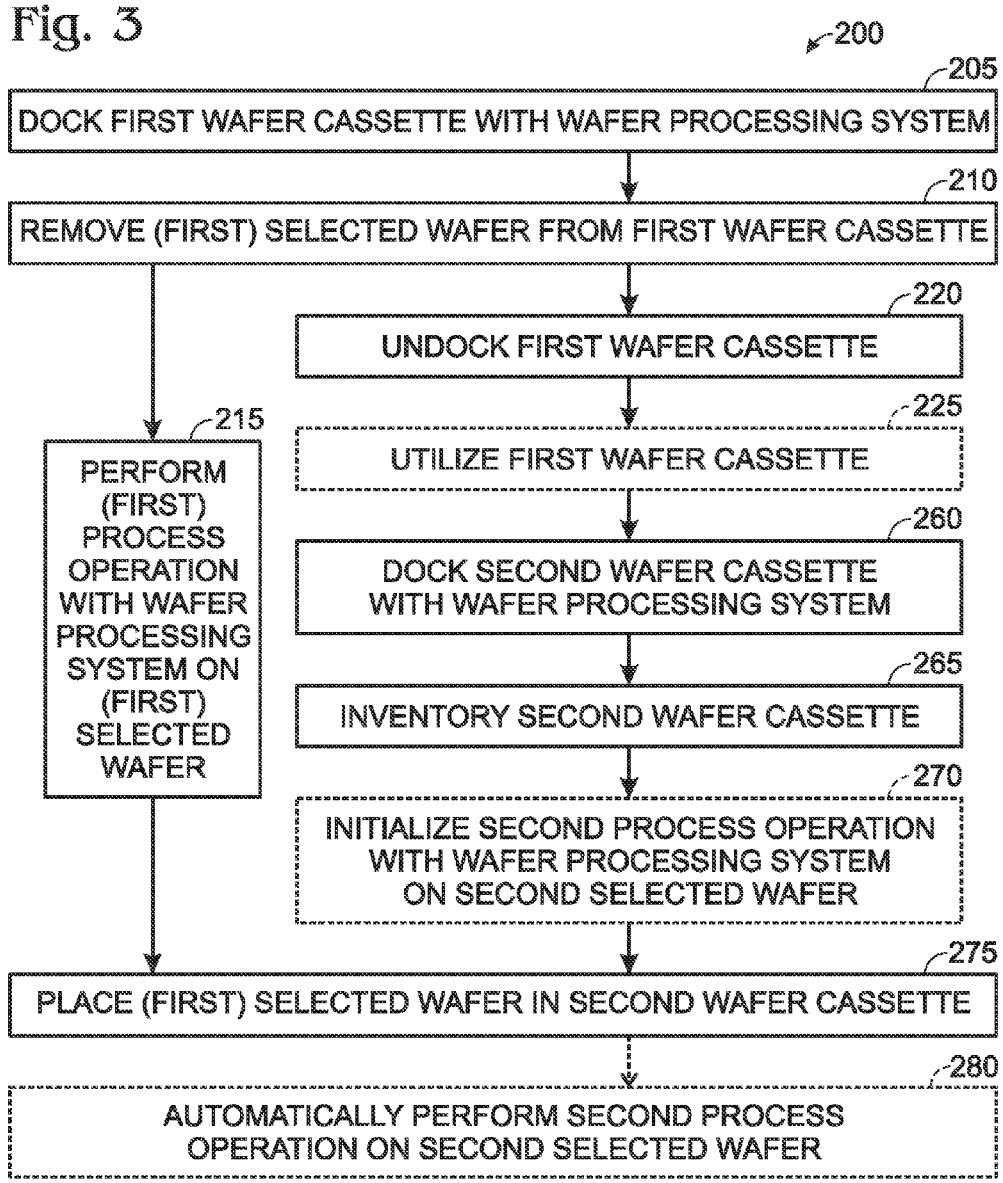

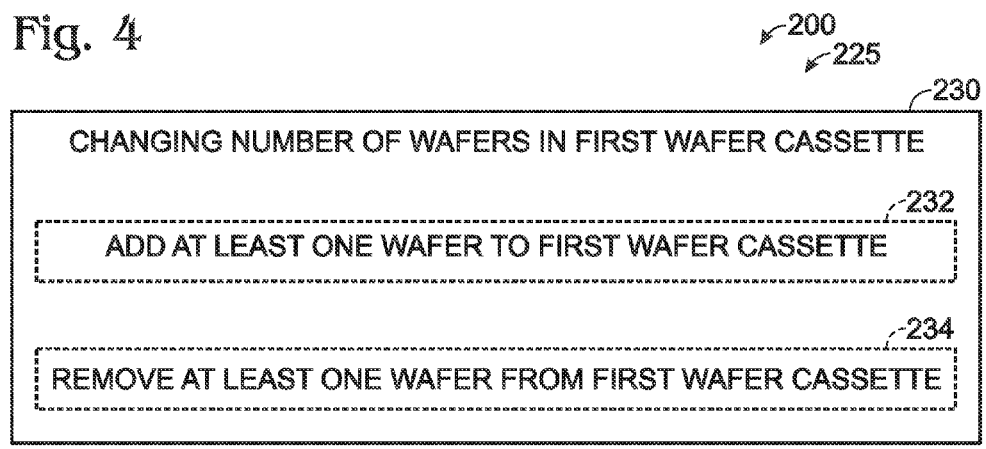
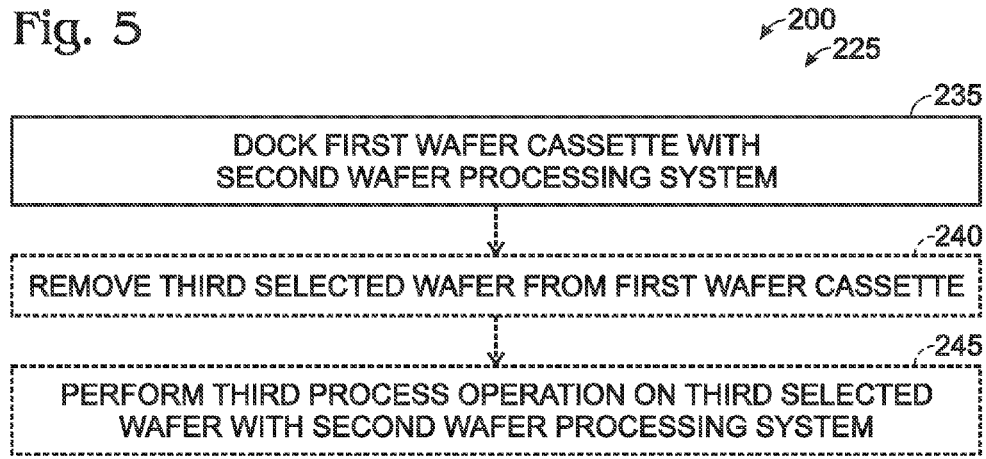

SYSTEMS AND METHODS FOR PROVIDING WAFER ACCESS IN A WAFER PROCESSING SYSTEM

RELATED APPLICATION

This application claims priority to U.S. Provisional Patent Application No. 61/747,703, which was filed on Dec. 31, 2012, and the complete disclosure of which is hereby incorporated by reference.

FIELD OF THE DISCLOSURE

The present disclosure is directed generally to systems and methods for providing wafer access in a wafer processing system, and more particularly to systems and methods that permit removal of a wafer cassette from the wafer processing system while the wafer processing system is performing a process operation on a selected wafer from the wafer cassette.

BACKGROUND OF THE DISCLOSURE

Semiconductor manufacturing facilities often utilize a wafer cassette that is configured to contain a plurality of wafers. The wafer cassette may contain the wafers when they are stored and/or transferred among a plurality of wafer processing systems that may be utilized during a semiconductor manufacturing process. The wafer cassettes include a plurality of slots, and each of these slots is configured to contain a respective wafer therein. Generally, the integrity of the wafers within a given wafer cassette is maintained throughout the semiconductor manufacturing process to provide inventory control and/or to ensure that the wafers proceed through the various steps of the manufacturing process in a desired order. In other words, a given wafer might be removed from a given wafer cassette during processing of the wafer on a given wafer processing system. However, the given wafer will be returned to the given wafer cassette subsequent to completion of the processing. In addition, the given wafer cassette will not be removed from the given wafer processing system until each of the wafers that is present therein has been processed by the given wafer processing system and returned to the given wafer cassette.

In the manufacturing facility, the processing steps that are performed by the various wafer processing systems are typically automated and may require little or no user intervention for completion thereof. In addition, the manufacturing facility typically will utilize safeguards and/or interlocks to ensure that a given wafer is returned to its designated wafer cassette, to prevent unintentional interruption of a processing step on a given wafer, and/or to restrict combining wafers from different wafer cassettes into another wafer cassette.

However, and in a research and/or development environment, the wafer processing systems may be only partially automated and/or may require more user input for the operation thereof. In addition, the process operations that may be performed by these wafer processing systems may require a much longer period of time to complete than a period of time that might be required for a comparable manufacturing operation. As illustrative, non-exclusive examples, metrology and/or test systems that are utilized in the research and/or development environment may oversample the wafers in order to generate improved data sets and/or statistically relevant data. Under these conditions, a significant amount of time may be wasted if a user is not available to initiate a new process operation on a given wafer processing system immediately upon completion of a previous process operation on the given wafer processing system.

Thus, there exists a need for improved systems and methods for providing wafer access in a wafer processing system.

SUMMARY OF THE DISCLOSURE

Systems and methods for providing wafer access in a wafer processing system are disclosed herein. The methods may include docking a first wafer cassette on the wafer processing system and removing a selected wafer from the first wafer cassette with the wafer processing system. The methods further may include performing a process operation on the selected wafer with the wafer processing system and undocking the first wafer cassette from the wafer processing system while performing the process operation. The methods also may include docking a second wafer cassette (which may be the same as or different from the first wafer cassette) on the wafer processing system, inventorying the second wafer cassette with the wafer processing system, and/or subsequently placing the selected wafer in the second wafer cassette.

In some embodiments, the first wafer cassette and the second wafer cassette are the same wafer cassette. In these embodiments, the methods further may include changing a number of wafers in the (first) wafer cassette subsequent to the undocking and prior to the docking of the wafer cassette. In some embodiments, the first wafer cassette is different from the second wafer cassette.

In some embodiments, the process operation is a first process operation, and the methods further include initializing a second process operation on a second selected wafer with the wafer processing system. In some embodiments, the initializing is at least partially concurrent with the performing the first process operation. In some embodiments, the second selected wafer is the same as the first selected wafer. In some embodiments, the second selected wafer is different from the first selected wafer. In some embodiments, the methods further may include automatically performing the second process operation on the second selected wafer subsequent to performing the first process operation on the first selected wafer. In some embodiments, an automated controller regulates at least a portion of the methods.

The systems may include wafer processing systems that are configured to perform at least a portion of the methods. The wafer processing systems may include a loading port, a wafer detecting system, a process module, a transfer assembly, and/or an automated controller. The automated controller may be programmed to control the operation of the wafer processing systems and/or to perform the portion of the methods. In some embodiments, the wafer processing systems include a probe system. In some embodiments, the probe system includes a chuck, a probe assembly, a signal generation assembly, and/or a signal analysis assembly.

BRIEF DESCRIPTION OF THE DRAWINGS

FIG. 3 is a flowchart depicting methods according to the present disclosure of providing wafer access in a wafer processing system.

FIG. 4 is a flowchart depicting methods according to the present disclosure of utilizing a wafer cassette.

FIG. 5 is another flowchart depicting methods according to the present disclosure of utilizing a wafer cassette.

DETAILED DESCRIPTION AND BEST MODE OF THE DISCLOSURE

Figure 1:
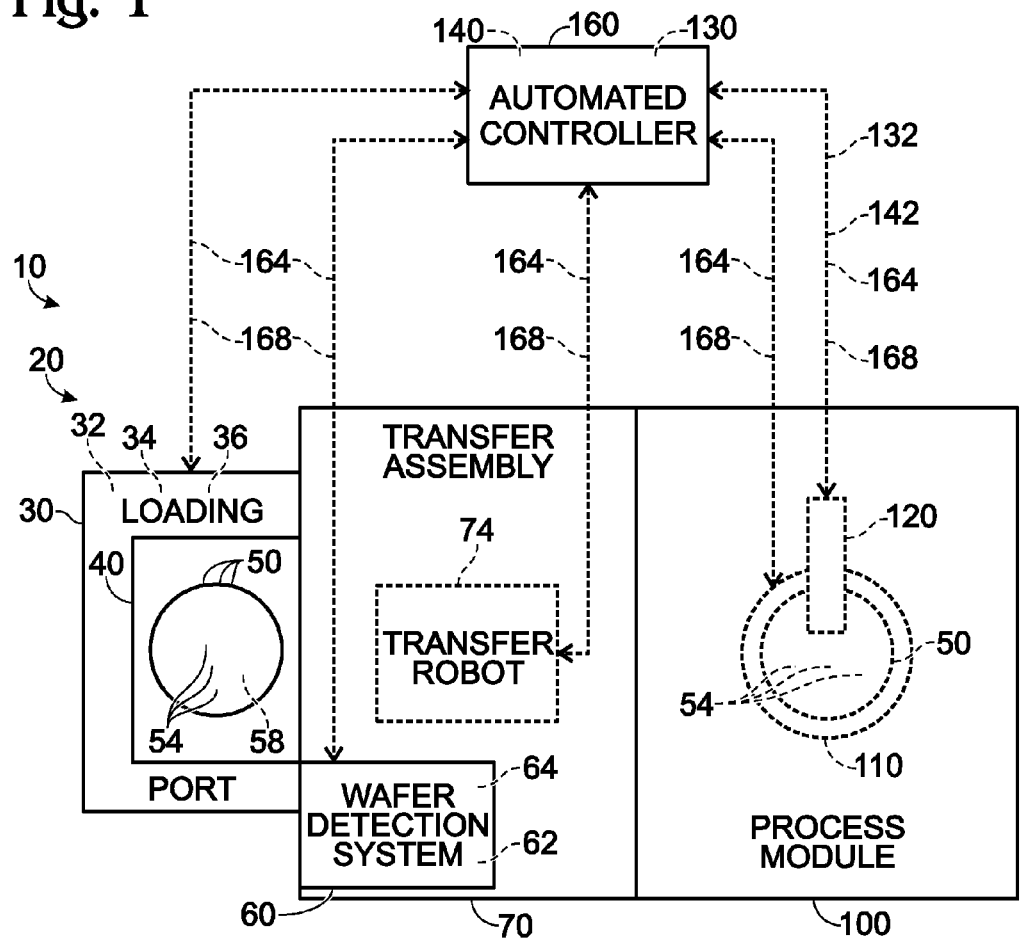
FIG. 1 is a schematic representation of illustrative, non-exclusive examples of a wafer processing system that may be utilized with and/or include the systems and methods according to the present disclosure.

FIG. 1 is a schematic representation of illustrative, non-exclusive examples of a wafer processing system 10 that may be utilized with and/or include the systems and methods according to the present disclosure. Wafer processing system 10 includes a loading port 30 that is configured to receive a wafer cassette 40 that contains one or more wafers 50. The wafer processing system also includes a process module 100 that is configured to perform one or more process operations on wafers 50, when present therein, and a transfer assembly 70 that is configured to convey wafers 50 between wafer cassette 40 and process module 100. In addition, the wafer processing system also includes a wafer detection system 60 that is configured to inventory wafer cassette 40 when the wafer cassette is present on loading port 30 and a controller 160 that is programmed to control the operation of at least a portion of the wafer processing system. Controller 160 may be an automated controller 160.

Wafers 50 may include and/or be any suitable structure that may be processed within wafer processing system 10 and/or may include a plurality of devices 54 located and/or formed thereon. The plurality of devices 54 also may be referred to herein as a plurality of devices under test (DUTs) 54. As illustrative, non-exclusive examples, wafers 50 may include and/or be any suitable substrate, semiconductor wafer, silicon wafer, and/or Group III-V semiconductor wafer. Similarly, devices 54 may include and/or be any suitable structure, illustrative, non-exclusive examples of which include integrated circuit devices, semiconductor devices, electronic devices, microelectronic mechanical systems, optoelectronic devices, and/or optical devices. The plurality of devices may include any suitable number of devices. As illustrative, non-exclusive examples, the plurality of devices 54 may include at least 100, at least 200, at least 300, at least 400, at least 500, at least 750, or at least 1000 devices.

Wafer processing system 10 may include and/or be any suitable structure that may be adapted and/or configured to perform any suitable process operation. This may include detecting any suitable property of wafers 50 and/or devices 54. Additionally or alternatively, this may include modifying wafers 50 and/or devices 54 in any suitable manner. As illustrative, non-exclusive examples, wafer processing system 10 may include and/or be any suitable test system, probe system, metrology system, lithography system, etch system, implant system, diffusion system, polishing system, and/or deposition system.

As another illustrative, non-exclusive example, wafer processing system 10 also may include and/or be a probe system 20 that is configured to contact and/or test one or more devices 54. Thus, and as illustrated in dashed lines in FIG. 1, wafer processing system 10 and/or process module 100 thereof also may include a chuck 110 that is configured to receive wafer 50 from transfer assembly 70 and/or locate wafer 50 within process module 100. In addition, and as also illustrated in dashed lines in FIG. 1, wafer processing system 10 and/or process module 100 thereof also may include a probe assembly 120 that is configured to contact one or more devices 54 during the testing thereof. Under these conditions, wafer processing system 10 also may include and/or be in communication with a signal generation assembly 130 that is configured to generate a test signal 132, with the test signal being provided to devices 54 by probe assembly 120. Additionally or alternatively, the wafer processing system also may include and/or be in communication with a signal analysis assembly 140 that is configured to receive a resultant signal 142 from devices 54 via probe assembly 120. Signal generation assembly 130 additionally or alternatively may be referred to as a test signal generation assembly 130 and signal analysis assembly 140 additionally or alternatively may be referred to as a resultant signal analysis assembly 140.

Illustrative, non-exclusive examples of chucks 110 that may be utilized with and/or included in the systems and methods according to the present disclosure include any suitable electrostatic chuck, vacuum chuck, and/or thermal chuck. Illustrative, non-exclusive examples of probe assemblies 120 that may be utilized with and/or included in the systems and methods according to the present disclosure include any suitable probe tip, probe card, needle probe, pyramid probe, membrane probe, space transformer, interposer, and/or electrical conduit. Illustrative, non-exclusive examples of signal generation assembly 130 that may be utilized with and/or included in the systems and methods according to the present disclosure include any suitable electrical power source, voltage generator, electric current generator, and/or function generator. Illustrative, non-exclusive examples of signal analysis assembly 140 that may be utilized with and/or included in the systems and methods according to the present disclosure include any suitable impedance analyzer, network analyzer, bit error rate tester, and/or spectrum analyzer.

Loading port 30 may include any suitable structure that may be adapted, configured, designed, and/or sized to receive, locate, and/or support wafer cassette 40, such as for docking with wafer processing system 10. As an illustrative, non-exclusive example, loading port 30 may include and/or define an upper surface 32 that supports the wafer cassette.

As another illustrative, non-exclusive example, loading port 30 also may include a retention structure 34. Retention structure 34 may be configured to transition between at least a retaining configuration, in which the retention structure retains wafer cassette 40 on loading port 30 and/or resists removal of the wafer cassette from the loading port, and a released configuration, in which the retention structure permits removal of wafer cassette 40 from loading port 30.

As yet another illustrative, non-exclusive example, loading port 30 also may include a cassette detector 36 that is configured to detect the presence (or absence) of wafer cassette 40 on the loading port. As an illustrative, non-exclusive example, the cassette detector may be configured to generate a status signal 168 that is indicative of the presence (or absence) of wafer cassette 40 on loading port 30.

Figure 2:
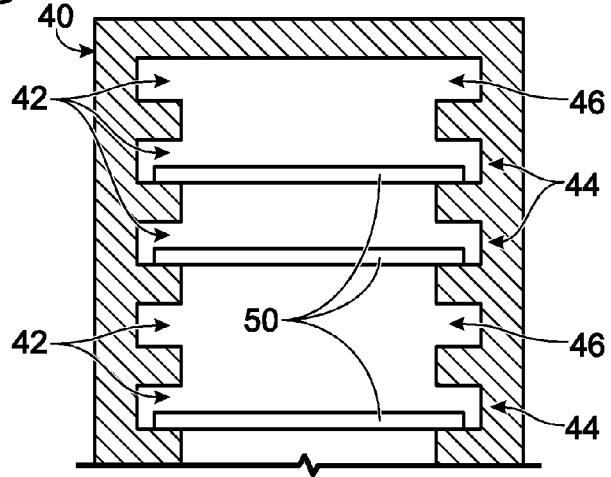
FIG. 2 is a schematic cross-sectional view of an illustrative, non-exclusive example of a wafer cassette that may be utilized with the systems and methods according to the present disclosure.

Wafer detection system 60 may include any suitable structure that may be configured to inventory wafer cassette 40 and/or to detect wafers 50 that may be contained therein. As an illustrative, non-exclusive example, and as illustrated in FIG. 2, wafer cassette 40 may include a plurality of slots 42, with each of the plurality of slots being configured to receive and/or contain a respective wafer 50. Under these conditions, wafer detection system 60 may be configured to detect the presence (or absence) of a respective wafer 50 in a respective slot 42. This may include distinguishing occupied slots 44 from unoccupied slots 46 and/or creating a slot map of the wafer cassette that may be indicative of the presence (or absence) of respective wafers 50 in respective slots 42.

Returning to FIG. 1, and as another illustrative, non-exclusive example, wafer detection system 60 also may be adapted, configured, designed, constructed, controlled and/or programmed to determine, read, detect and/or otherwise quantify a unique identifier 58 that may be associated with and/or located on each wafer 50. This may include detecting the unique identifier in any suitable manner. As an illustrative, non-exclusive example, the wafer detection system may include an optical imaging device 62 that may be configured to collect an optical image of the unique identifier. As another illustrative, non-exclusive example, wafer detection system 60 may include an identifier detector 64 that may be configured to detect the unique identifier. Illustrative, non-exclusive examples of unique identifiers 58 according to the present disclosure include any suitable serial number, laser scribe, optically detectable indicia or identifier, barcode, magnetic identifier, and/or radio frequency identifier. When wafers 50 include unique identifiers 58, it is within the scope of the present disclosure that wafer processing system 10, probe system 20, and/or wafer detection system 60 thereof further may be configured to associate a given unique identifier for a given wafer with a slot in which the given wafer is located. Additionally or alternatively, the slot map, when created, may correlate a specific wafer 50 and/or a specific unique identifier 58 thereof with a specific slot 42 that contains the specific wafer.

Transfer assembly 70 may include any suitable structure that may be adapted, configured, designed, constructed, controlled, and/or programmed to selectively transfer one or more wafers 50 between the wafer cassette and the process module. This may include initially transferring a given wafer 50 from the wafer cassette to the process module and subsequently transferring the given wafer from the process module to the wafer cassette, such as after completion of a process operation thereon. As an illustrative, non-exclusive example, and as indicated in dashed lines in FIG. 1, transfer assembly 70 may include and/or be a transfer robot 74. Transfer robot 74 additionally or alternatively may be referred to as a transfer structure and/or transfer device 74.

Controller 160, which also may be an automated controller 160, may include any suitable structure that may be adapted, configured, and/or programmed to control the operation of at least a portion of wafer processing system 10. As an illustrative, non-exclusive example, controller 160 may be programmed to perform any of the methods 200 that are discussed herein. As another illustrative, non-exclusive example, controller 160 may be configured to provide one or more control signals 164 to any suitable component of the wafer processing system to control the operation thereof. Additionally or alternatively, controller 160 also may be configured to receive one or more status signals 168 from any suitable component of the wafer processing system, with the status signal being indicative of a status of the component of the wafer processing system.

As yet another illustrative, non-exclusive example, controller 160 may be in communication with loading port 30, including retention structure 34 and/or cassette detector 36 thereof. Thus, controller 160 may be configured to provide control signal 164 to retention structure 34 to selectively transition the retention structure between the retaining configuration and the released configuration and/or to selectively permit removal of wafer cassette 40 from the loading port. Additionally or alternatively, controller 160 also may be configured to receive status signal 168 from cassette detector 36, with the status signal indicating the presence (or absence) of wafer cassette 40 on loading port 30.

As another illustrative, non-exclusive example, controller 160 may be in communication with wafer detection system 60 and/or optical imaging device 62 thereof. Thus, controller 160 may be configured to provide control signal 164 to wafer detection system 60 to initiate inventorying of the wafer cassette. Additionally or alternatively, controller 160 also may be configured to receive status signal 168 from the wafer detection system, with the status signal being indicative of the wafer inventory of the wafer cassette and/or of the unique identifiers of the wafers that are contained within the wafer cassette.

As yet another illustrative, non-exclusive example, controller 160 may be in communication with transfer assembly 70 and/or transfer robot 74 thereof. Thus, controller 160 may be configured to provide control signal 164 to transfer assembly 70, such as to initiate and/or control transfer of wafer 50 from wafer cassette 40 to process module 100 and/or to initiate and/or control transfer of wafer 50 from process module 100 to wafer cassette 40.

As another illustrative, non-exclusive example, controller 160 may be programmed to remove a selected wafer from a first wafer cassette with transfer assembly 70 and/or to perform a process operation on the selected wafer with process module 100. Controller 160 further may be programmed to permit the first wafer cassette to be undocked from loading port 30 and also to permit a second wafer cassette to be docked on loading port 30 while process module 100 is performing the process operation on the selected wafer.

As yet another illustrative, non-exclusive example, when wafer processing system 10 includes probe system 20, controller 160 may be in communication with chuck 110 and/or probe assembly 120. Thus, controller 160 may be configured to provide control signal 164 to the chuck and/or the probe assembly to control the operation thereof. This may include controlling the chuck and/or the probe assembly to initiate and/or maintain contact between the probe assembly and device 54 and/or controlling the chuck and/or the probe assembly to cease contact between the probe assembly and the device. Additionally or alternatively, and when controller 160 includes and/or is in communication with signal generation assembly 130 and/or resultant signal analysis assembly 140, this also may include providing test signal 132 to device 54 and/or receiving resultant signal 142 from the device.

FIG. 3 is a flowchart depicting methods 200 according to the present disclosure of providing and/or controlling wafer access in a wafer processing system, such as wafer processing system 10 of FIG. 1. Methods 200 include docking a first wafer cassette with the wafer processing system at 205, removing a selected wafer from the first wafer cassette at 210, and performing a process operation on the selected wafer with the wafer processing system at 215.

In addition, and at least partially concurrently (or in parallel) with the performing at 215, methods 200 also include undocking the first wafer cassette from the wafer processing system at 220 and may include utilizing the first wafer cassette at 225. Methods 200 further include docking a second wafer cassette with the wafer processing system at 260 and inventorying the second wafer cassette at 265. Methods 200 also may include initializing a second process operation on a second selected wafer from the second wafer cassette with the wafer processing system at 270. In addition, and subsequent to at least the performing at 215 and the inventorying at 265, methods 200 further may include placing the (first) selected wafer in the second wafer cassette at 275 and may include automatically performing the second process operation on the second selected wafer at 280.

Docking the first wafer cassette with the wafer processing system at 205 and/or docking the second wafer cassette with the wafer processing system at 260 may include docking the first, or second, wafer cassette with the wafer processing system and/or with, or on, a loading port thereof. This may include interfacing the first, or second, wafer cassette with the wafer processing system and/or opening the first, or second, wafer cassette to permit access to the wafers that are contained therein. It is within the scope of the present disclosure that the docking at 205 and/or 260 also may include establishing physical contact between the wafer cassette and the wafer processing system and/or between the wafer cassette and the loading port. Docking a wafer cassette optionally also may be referred to as loading, inserting, coupling, and/or installing a wafer cassette.

As discussed herein, the wafer processing system may include an automated controller. Under these conditions, methods 200 further may include monitoring, controlling, permitting, allowing, and/or regulating the docking at 205 with the automated controller. Similarly, methods 200 also may include monitoring, controlling, permitting, allowing, and/or regulating the docking at 260 with the automated controller.

Removing the selected wafer from the first wafer cassette at 210 may include removing any suitable wafer from the first wafer cassette and/or moving the selected wafer from the first wafer cassette and into the wafer processing system. As an illustrative, non-exclusive example, the removing at 210 may include moving the selected wafer with a transfer assembly of the wafer processing system and/or moving the selected wafer into a process module of the wafer processing system. Illustrative, non-exclusive examples of wafer transfer assemblies and/or wafer process modules that may be utilized with and/or include the systems and methods according to the present disclosure are discussed in more detail herein. When the wafer processing system includes the automated controller, methods 200 may include monitoring, controlling, permitting, allowing, and/or regulating the removing at 210 with the automated controller.

Performing the process operation with the wafer processing system on the selected wafer at 215 may include performing any suitable process operation, illustrative, non-exclusive examples of which are discussed in more detail herein, on the selected wafer. As illustrative, non-exclusive examples, the performing at 215 may include modifying the selected wafer, adding a material to the selected wafer, removing a material from the selected wafer, detecting a property of the selected wafer, detecting a contaminant that may be present on and/or in the selected wafer, providing a test signal to the selected wafer, receiving a resultant signal from the selected wafer, electrically testing the selected wafer, and/or testing an operation of at least a portion of the selected wafer and/or of one or more devices that may be present thereon.

As an illustrative, non-exclusive example, the selected wafer may include a plurality of devices, and the performing at 215 may include performing the process operation on at least a portion of the plurality of devices. Illustrative, non-exclusive examples of the plurality of devices are disclosed herein. Illustrative, non-exclusive examples of the portion of the plurality of devices include at least 10%, at least 20%, at least 30%, at least 40%, at least 50%, at least 60%, at least 70%, at least 80%, at least 90%, at least 95%, at least 99%, or 100% of the plurality of devices.

As another illustrative, non-exclusive example, the performing at 215 also may include contacting, probing, and/or testing the selected wafer with a probe system, illustrative, non-exclusive examples of which are discussed in more detail herein. Although not required, it is within the scope of the present disclosure that the systems and methods disclosed herein may be utilized and/or performed in a research and/or development environment. Thus, and as discussed, the performing at 215 may include performing for an operation time that is greater than an operation time that might be utilized to perform a comparable operation in a manufacturing, or high-volume manufacturing, environment. As illustrative, non-exclusive examples, the operation time may be least 1, at least 2, at least 3, at least 4, at least 5, at least 6, at least 7, at least 8, at least 10, at least 12, at least 14, at least 16, at least 18, or at least 20 hours.

As discussed, the wafer processing system may include the automated controller. Under these conditions, methods 200 may include monitoring, controlling, permitting, allowing, and/or regulating the performing at 215 with the automated controller.

Undocking the first wafer cassette from the wafer processing system at 220 may include removing the first wafer cassette from the wafer processing system and/or from the loading port thereof. This may include undocking the first wafer cassette at least partially concurrently with the performing at 215, undocking the first wafer cassette during the performing at 215, and/or undocking the first wafer cassette while the selected wafer is located and/or placed within the wafer processing system and/or the process module thereof.

As an illustrative, non-exclusive example, and subsequent to the docking at 205 but prior to the undocking at 220, the first wafer cassette may be in physical contact with at least a portion of the wafer processing system. However, and subsequent to the undocking at 220, the first wafer cassette may not be in physical contact with the wafer processing system. However, the selected wafer still may be contained within and/or may be in physical contact with the wafer processing system.

It is within the scope of the present disclosure that the undocking at 220 also may include determining that the first wafer cassette is, or has been, undocked from the wafer processing system. This may include detecting that the first wafer cassette is undocked from the wafer processing system, detecting that the first wafer cassette is no longer in contact with the wafer processing system, and/or detecting that the first wafer cassette is no longer in contact with a loading port of the wafer processing system, such as via the use of a cassette detector, as discussed herein.

When the wafer processing system includes an automated controller, methods 200 may include monitoring, controlling, permitting, allowing, and/or regulating the undocking at 220 with the automated controller. Additionally or alternatively, methods 200 also may include monitoring, controlling, permitting, allowing, and/or regulating the determining that the first wafer cassette has been undocked from the wafer processing system with the automated controller.

Utilizing the first wafer cassette at 225 may be performed at least partially concurrently with the performing at 215 and may include performing any suitable process operation on one or more wafers that may be present within the first wafer cassette and/or modifying the contents of the first wafer cassette. More specific but still illustrative, non-exclusive examples of the utilizing at 225 are discussed in more detail herein with reference to FIGS. 4-5.

Docking the second wafer cassette with the wafer processing system at 260 may include docking any suitable wafer cassette with the wafer processing system, may be at least substantially similar to the docking at 205, and/or may be performed at least partially concurrently with the performing at 215. It is within the scope of the present disclosure that the docking at 260 may (but is not required to) include re-docking the first wafer cassette with the wafer processing system and may be subsequent to the utilizing at 225. Thus, the first wafer cassette and the second wafer cassette may include and/or be the same wafer cassette, a single wafer cassette, and/or a selected wafer cassette. Alternatively, it is within the scope of the present disclosure that the docking at 260 may include docking a second wafer cassette that is different from and/or not the same as the first wafer cassette. Under these conditions, the docking at 260 may be performed at least partially concurrently with the utilizing at 225.

Inventorying the second wafer cassette at 265 may include utilizing any suitable system and/or method to inventory the second wafer cassette and may be performed at least partially concurrently with the performing at 215. As an illustrative, non-exclusive example, the inventorying at 265 may include inventorying with a wafer detection system, illustrative, non-exclusive examples of which are discussed in more detail herein. As another illustrative, non-exclusive example, the inventorying at 265 may include reading a unique identifier of each wafer that is located within the second wafer cassette. As yet another illustrative, non-exclusive example, and as discussed, the second wafer cassette may include and/or define a plurality of slots, and the inventorying at 265 may include determining which of the plurality of slots contains a wafer, establishing a slot map for the second wafer cassette, and/or associating a unique identifier for a given wafer with a slot in which the given wafer is located.

When the wafer processing system includes the automated controller, methods 200 may include monitoring, controlling, permitting, allowing, and/or regulating the inventorying at 265 with the automated controller. Under these conditions, the inventorying at 265 further may include generating an inventory of the second wafer cassette and/or storing the inventory of the second wafer cassette with, within, and/or via the automated controller and/or a memory device associated with the automated controller.

It is within the scope of the present disclosure that the selected wafer may be a first selected wafer and that the performing at 215 may include performing a first process operation with the wafer processing assembly on the first selected wafer. Under these conditions, methods 200 may include initializing the second process operation with the wafer processing system on the second selected wafer at 270. This may include configuring and/or preparing the wafer processing system to perform the second process operation on the second selected wafer and may be performed at least partially concurrently with the performing at 215. In addition, and when the wafer processing system includes the automated controller, methods 200 may include monitoring, controlling, permitting, allowing, and/or regulating the initializing at 270 with the automated controller.

It is within the scope of the present disclosure that the second selected wafer may not be present in the first wafer cassette subsequent to the docking at 205 and prior to the undocking at 220 and/or that the second selected wafer may be different from the first selected wafer. As an illustrative, non-exclusive example, and when the second wafer cassette is the same wafer cassette as the first wafer cassette (as discussed herein with reference to the docking at 260), the second selected wafer may include and/or be an added wafer that may be added to the first wafer cassette during the utilizing at 225. As another illustrative, non-exclusive example, and when the second wafer cassette is different from the first wafer cassette (as also discussed herein with reference to the docking at 260), the second selected wafer may be one of the wafers from the second wafer cassette.

Placing the selected wafer in the second wafer cassette at 275 may include placing the selected wafer in any suitable empty wafer slot of the plurality of wafer slots that is present within the second wafer cassette. As discussed, and when methods 200 include the initializing at 270, the selected wafer may be the first selected wafer.

When the wafer processing system includes the automated controller, methods 200 may include monitoring, controlling, permitting, allowing, and/or regulating the placing at 275 with the automated controller. This may include selecting a location, or slot, for the selected wafer within the second wafer cassette with the automated controller.

When methods 200 include the initializing at 270, the methods further may include automatically performing the second process operation on the second selected wafer at 280. This may include automatically performing, or automatically initiating, the second process operation on the second selected wafer subsequent to completion of the performing at 215 and/or subsequent to the placing at 275. Additionally or alternatively, the performing at 280 also may include automatically performing the second process operation on the second selected wafer without human intervention and/or without human intervention that is subsequent to the initializing at 270. When the wafer processing system includes the automated controller, methods 200 may include monitoring, controlling, permitting, allowing, and/or regulating the automatically performing at 280 with the automated controller.

FIG. 4 is a flowchart depicting methods 225 according to the present disclosure of utilizing a first wafer cassette. The methods 225 include changing a number of wafers in the first wafer cassette at 230 and may be performed at least partially concurrently with the performing at 215 (as illustrated in FIG. 3). This may include adding at least one added wafer to the first wafer cassette at 232 and/or removing at least one removed wafer from the first wafer cassette at 234. It is within the scope of the present disclosure that the changing at 230 may be performed subsequent to the undocking at 220 (as discussed herein with reference to FIG. 3) and prior to the docking at 260 (as also discussed herein with reference to FIG. 3) and that the docking at 260 may include re-docking the first wafer cassette (as also discussed herein with reference to FIG. 3).

It is also within the scope of the present disclosure that, when methods 225 include the adding at 232, the added wafer may be different from at least one of the other wafers that may be present within the first wafer cassette subsequent to the adding at 232. As illustrative, non-exclusive examples, the added wafer may be manufactured using a different manufacturing process, may be at a different process step, may be constructed of a different material, and/or may include a different material than at least one of the other wafers that may be present within the first wafer cassette subsequent to the adding at 232.

FIG. 5 is another flowchart depicting methods 225 according to the present disclosure of utilizing a first wafer cassette. It is within the scope of the present disclosure that the wafer processing system of FIG. 3 is a first wafer processing system, that the selected wafer of FIG. 3 is a first selected wafer, and that the process operation of FIG. 3 is a first process operation. Under these conditions, methods 225 may include docking the first wafer cassette with a second wafer processing system at 235, removing a third selected wafer from the first wafer cassette at 240, and/or performing a third process operation on the third selected wafer with the second wafer processing system at 245.

Docking the first wafer cassette with the second wafer processing system at 235 may include docking the first wafer cassette with a second wafer processing system that is different from the first wafer processing system. The docking at 235 may be at least substantially similar to the docking at 205 (as discussed in more detail herein with reference to FIG. 3) and may include interfacing the first wafer cassette with the second wafer processing system, opening the first wafer cassette to permit access to the wafers that are contained therein by the second wafer processing system, and/or establishing physical contact between the first wafer cassette and the second wafer processing system. Additionally or alternatively, the docking at 235 also may be performed at least partially concurrently with the performing at 215 (as discussed in more detail herein with reference to FIG. 3).

Removing the third selected wafer from the first wafer cassette at 240 may include removing the third selected wafer with the second wafer processing system and/or moving the third selected wafer into the second wafer processing system. This may be at least substantially similar to the removing at 210 (as discussed in more detail herein with reference to FIG. 3), and may be performed at least partially concurrently with the performing at 215 (as also discussed in more detail herein with reference to FIG. 3).

Performing the third process operation on the third selected wafer at 245 may include performing the third process operation with the second wafer processing system. This may be at least substantially similar to the performing at 215 (as discussed in more detail herein with reference to FIG. 3) and may be performed at least partially concurrently with the performing at 215.

In the present disclosure, several of the illustrative, non-exclusive examples have been discussed and/or presented in the context of flow diagrams, or flow charts, in which the methods are shown and described as a series of blocks, or steps. Unless specifically set forth in the accompanying description, it is within the scope of the present disclosure that the order of the blocks may vary from the illustrated order in the flow diagram, including with two or more of the blocks (or steps) occurring in a different order and/or concurrently. It is also within the scope of the present disclosure that the blocks, or steps, may be implemented as logic, which also may be described as implementing the blocks, or steps, as logics. In some applications, the blocks, or steps, may represent expressions and/or actions to be performed by functionally equivalent circuits or other logic devices. The illustrated blocks may, but are not required to, represent executable instructions that cause a computer, processor, and/or other logic device to respond, to perform an action, to change states, to generate an output or display, and/or to make decisions.

As used herein, the term "and/or" placed between a first entity and a second entity means one of (1) the first entity, (2) the second entity, and (3) the first entity and the second entity. Multiple entities listed with "and/or" should be construed in the same manner, i.e., "one or more" of the entities so conjoined. Other entities may optionally be present other than the entities specifically identified by the "and/or" clause, whether related or unrelated to those entities specifically identified. Thus, as a non-limiting example, a reference to "A and/or B," when used in conjunction with open-ended language such as "comprising" may refer, in one embodiment, to A only (optionally including entities other than B); in another embodiment, to B only (optionally including entities other than A); in yet another embodiment, to both A and B (optionally including other entities). These entities may refer to elements, actions, structures, steps, operations, values, and the like.

As used herein, the phrase "at least one," in reference to a list of one or more entities should be understood to mean at least one entity selected from any one or more of the entity in the list of entities, but not necessarily including at least one of each and every entity specifically listed within the list of entities and not excluding any combinations of entities in the list of entities. This definition also allows that entities may optionally be present other than the entities specifically identified within the list of entities to which the phrase "at least one" refers, whether related or unrelated to those entities specifically identified. Thus, as a non-limiting example, "at least one of A and B" (or, equivalently, "at least one of A or B," or, equivalently "at least one of A and/or B") may refer, in one embodiment, to at least one, optionally including more than one, A, with no B present (and optionally including entities other than B); in another embodiment, to at least one, optionally including more than one, B, with no A present (and optionally including entities other than A); in yet another embodiment, to at least one, optionally including more than one, A, and at least one, optionally including more than one, B (and optionally including other entities). In other words, the phrases "at least one," "one or more," and "and/or" are open-ended expressions that are both conjunctive and disjunctive in operation. For example, each of the expressions "at least one of A, B and C," "at least one of A, B, or C," "one or more of A, B, and C," "one or more of A, B, or C" and "A, B, and/or C" may mean A alone, B alone, C alone, A and B together, A and C together, B and C together, A, B and C together, and optionally any of the above in combination with at least one other entity.

In the event that any patents, patent applications, or other references are incorporated by reference herein and define a term in a manner or are otherwise inconsistent with either the non-incorporated portion of the present disclosure or with any of the other incorporated references, the non-incorporated portion of the present disclosure shall control, and the term or incorporated disclosure therein shall only control with respect to the reference in which the term is defined and/or the incorporated disclosure was originally present.

As used herein the terms "adapted" and "configured" mean that the element, component, or other subject matter is designed and/or intended to perform a given function. Thus, the use of the terms "adapted" and "configured" should not be construed to mean that a given element, component, or other subject matter is simply "capable of" performing a given function but that the element, component, and/or other subject matter is specifically selected, created, implemented, utilized, programmed, and/or designed for the purpose of performing the function. It is also within the scope of the present disclosure that elements, components, and/or other recited subject matter that is recited as being adapted to perform a particular function may additionally or alternatively be described as being configured to perform that function, and vice versa.

Illustrative, non-exclusive examples of systems and methods according to the present disclosure are presented in the following enumerated paragraphs. It is within the scope of the present disclosure that an individual step of a method recited herein, including in the following enumerated paragraphs, may additionally or alternatively be referred to as a "step for" performing the recited action.

A1. A method of providing wafer access in a wafer processing system, the method comprising:

docking a first wafer cassette with the wafer processing system, wherein the first wafer cassette includes a plurality of first slots, wherein the plurality of first slots is configured to contain a plurality of wafers, and further wherein at least one of the plurality of first slots contains a wafer;

removing a selected wafer from the first wafer cassette with the wafer processing system;

performing a process operation on the selected wafer with the wafer processing system;

undocking the first wafer cassette from the wafer processing system during the performing;

docking a second wafer cassette with the wafer processing system;

inventorying the second wafer cassette with the wafer processing system subsequent to the docking the second wafer cassette; and placing the selected wafer in the second wafer cassette subsequent to the performing, the undocking the first wafer cassette, the docking the second wafer cassette, and the inventorying.

A2. The method of paragraph A1, wherein the first wafer cassette and the second wafer cassette are the same wafer cassette.

A3. The method of paragraph A2, wherein, subsequent to the undocking and prior to the docking the second wafer cassette, the method further includes changing a number of wafers in the first wafer cassette, optionally wherein the changing includes adding at least one added wafer to the first wafer cassette, and further optionally wherein the changing includes removing at least one removed wafer from the first wafer cassette.

A4. The method of paragraph A1, wherein the first wafer cassette is different from the second wafer cassette.

A5. The method of any of paragraphs A1-A4, wherein the process operation is a first process operation, wherein the selected wafer is a first selected wafer, and further wherein, subsequent to the inventorying, the method further includes initializing a second process operation on a second selected wafer with the wafer processing system, optionally wherein the initializing is at least partially concurrent with the performing the first process operation.

A6. The method of paragraph A5, wherein the initializing includes preparing the wafer processing system to perform the second process operation.

A7. The method of any of paragraphs A5-A6, wherein the second selected wafer was not present within the first wafer cassette subsequent to the docking the first wafer cassette and prior to the undocking the first wafer cassette.

A8. The method of any of paragraphs A5-A7, when dependent from paragraph A3, wherein the second selected wafer is the at least one added wafer.

A9. The method of any of paragraphs A5-A8, wherein the first selected wafer is different from the second selected wafer.

A10. The method of any of paragraphs A5-A9, wherein, subsequent to performing the first process operation on the first selected wafer, the method further includes automatically performing the second process operation on the second selected wafer, and optionally wherein the automatically performing includes automatically performing without human intervention subsequent to the initializing.

A11. The method of any of paragraphs A1-A10, wherein the wafer processing system is a first wafer processing system, wherein the selected wafer is a/the first selected wafer, and further wherein the process operation is a/the first process operation.

A12. The method of paragraph A11, wherein, subsequent to the undocking, the method further includes docking the first wafer cassette on a second wafer processing system, optionally concurrently with the performing the first process operation.

A13. The method of paragraph A12, wherein the method further includes removing a third selected wafer from the first wafer cassette with the second wafer processing system, optionally concurrently with the performing the first process operation.

A14. The method of any of paragraphs A12-A13, wherein the method further includes performing a third process operation on the third selected wafer with the second wafer processing system, optionally concurrently with the performing the first process operation.

A15. The method of any of paragraphs A1-A14, wherein the performing the process operation includes at least one of modifying the selected wafer, adding a material to the selected wafer, removing a material from the selected wafer, detecting a property of the selected wafer, detecting a contaminant on the selected wafer, providing a test signal to the selected wafer, receiving a resultant signal from the selected wafer, electrically testing the selected wafer, and testing an operation of at least a portion of the selected wafer.

A16. The method of any of paragraphs A1-A15, wherein, subsequent to docking the first wafer cassette, the first wafer cassette is in physical contact with the wafer processing system, and further wherein, subsequent to undocking the first wafer cassette, the first wafer cassette is not in physical contact with the wafer processing system.

A17. The method of any of paragraphs A1-A16, wherein the method further includes determining that the first wafer cassette is undocked from the wafer processing system, and optionally wherein the determining includes detecting that the first wafer cassette is undocked from the wafer processing system.

A18. The method of any of paragraphs A1-A17, wherein docking the second wafer cassette includes establishing physical contact between the second wafer cassette and the wafer processing system.

A19. The method of any of paragraphs A1-A18, wherein the inventorying further includes reading a unique identifier of each/any wafer that is located within the second wafer cassette.

A20. The method of any of paragraphs A1-A19, wherein the second wafer cassette includes a plurality of second slots, wherein each of the plurality of second slots is configured to contain a wafer, and further wherein the inventorying includes determining which of the plurality of second slots contains a wafer.

A21. The method of paragraph A20, wherein the inventorying further includes establishing a slot map for the second wafer cassette.

A22. The method of any of paragraphs A20-A21, wherein the placing includes placing the selected wafer in an empty slot of the plurality of second slots.

A23. The method of any of paragraphs A1-A22, wherein the performing the process operation includes performing the process operation for at least 1, at least 2, at least 3, at least 4, at least 5, at least 6, at least 7, at least 8, at least 10, at least 12, at least 14, at least 16, at least 18, or at least 20 hours.

A24. The method of any of paragraphs A1-A23, wherein the wafer processing system includes at least one of a test system, a probe system, a metrology system, a lithography system, an etch system, an implant system, a diffusion system, a polishing system, and a deposition system.

A25. The method of any of paragraphs A1-A24, wherein the wafer processing system includes an automated controller.

A26. The method of paragraph A25, wherein the method further includes regulating the docking the first wafer cassette with the automated controller.

A27. The method of any of paragraphs A25-A26, wherein the method further includes regulating the removing the selected wafer from the first wafer cassette with the automated controller.

A28. The method of any of paragraphs A25-A27, wherein the method further includes regulating the performing the process operation on the selected wafer with the automated controller.

A29. The method of any of paragraphs A25-A28, wherein the method further includes regulating the undocking the first wafer cassette with the automated controller.

A30. The method of any of paragraphs A25-A29, wherein the method further includes regulating the docking the second wafer cassette with the automated controller.

A31. The method of any of paragraphs A25-A30, wherein the method further includes regulating the inventorying the second wafer cassette with the automated controller.

A32. The method of paragraph A31, wherein the inventorying includes generating an inventory of the second wafer cassette, and further wherein the method includes storing the inventory of the second wafer cassette with the automated controller, and optionally in a memory device associated with the automated controller.

A33. The method of any of paragraphs A25-A32, wherein the method further includes regulating the placing the selected wafer in the second wafer cassette with the automated controller.

A34. The method of paragraph A33, wherein the method further includes selecting a location for the selected wafer in the second wafer cassette with the automated controller.

A35. The method of any of paragraphs A25-A34, when dependent from paragraph A5, wherein the method further includes regulating the initializing the second process operation with the automated controller.

A36. The method of any of paragraphs A25-A35, when dependent from paragraph A10, wherein the method further includes regulating the automatically performing the second process operation with the automated controller.

A37. The method of any of paragraphs A25-A36, when dependent from paragraph A17, wherein the method further includes regulating the determining that the first wafer cassette is undocked from the wafer processing system with the automated controller.

A38. The method of any of paragraphs A1-A37, wherein the selected wafer includes a plurality of devices, and further wherein the performing the process operation includes performing the process operation on at least a portion of the plurality of devices.

A39. The method of paragraph A38, wherein the plurality of devices includes at least 100, at least 200, at least 250, at least 500, at least 750, or at least 1000 devices.

A40. The method of any of paragraphs A38-A39, wherein the portion of the plurality of devices includes at least 10%, at least 20%, at least 30%, at least 40%, at least 50%, at least 60%, at least 70%, at least 80%, at least 90%, at least 95%, at least 99%, or 100% of the plurality of devices.

B1. A wafer processing system that is configured to perform at least one process operation on a wafer, the wafer processing system comprising:
 a loading port that is configured to receive a wafer cassette;
 a wafer detection system that is configured to inventory the wafer cassette;
 a process module that is configured to perform the at least one process operation on a selected wafer;
 a transfer assembly that is configured to transfer the selected wafer between the wafer cassette and the process module; and
 an automated controller that is programmed to control the operation of the wafer processing system using the method of any of paragraphs A1-A40.

B2. A wafer processing system that is configured to perform at least one process operation on a wafer, the wafer processing system comprising:
 a loading port that is configured to receive a wafer cassette;
 a wafer detection system that is configured to inventory the wafer cassette;
 a process module that is configured to perform the at least one process operation on a selected wafer;
 a transfer assembly that is configured to transfer the selected wafer between the wafer cassette and the process module; and
 an automated controller that is programmed to:
 (i) remove the selected wafer from a first wafer cassette with the transfer assembly;
 (ii) perform at least one process operation on the selected wafer with the process module; and
 (iii) permit the first wafer cassette to be undocked from the loading port and a second wafer cassette to be docked on the loading port while the process module performs the at least one process operation on the selected wafer.

B3. The wafer processing system of paragraph B2, wherein the automated controller is further configured to control the operation of the wafer processing system using any suitable step and/or method of any of paragraphs A1-A40.

B4. The wafer processing system of any of paragraphs B1-B3, wherein the wafer processing system includes at least one of a test system, a metrology system, a lithography system, an etch system, an implant system, a diffusion system, a polishing system, and a deposition system.

B5. The wafer processing system of any of paragraphs B1-B3, wherein the wafer processing system includes a probe system that is configured to test a device that is located on the wafer, and further wherein the wafer processing system includes:
 a chuck that is configured to receive the wafer from the transfer assembly;
 a probe assembly that is configured to contact the device;
 a signal generation assembly that is configured to provide a test signal to the device via the probe assembly; and
 a signal analysis assembly that is configured to receive a resultant signal from the device via the probe assembly.

B6. The wafer processing system of any of paragraphs B1-B5, wherein the selected wafer includes a plurality of devices.

B7. The wafer processing system of paragraph B6, wherein the plurality of devices includes at least 100, at least 200, at least 250, at least 500, at least 750, or at least 1000 devices.

B8. The wafer processing system of any of paragraphs B1-B7, wherein the wafer processing system further includes the selected wafer.

C1. The method of any of paragraphs A1-A40 or the wafer processing system of any of paragraphs B1-B8, wherein the selected wafer is a semiconductor wafer.

C2. The method of paragraph C1 or the wafer processing system of paragraph C1, wherein the semiconductor wafer includes at least one of a silicon wafer and a Group III-V semiconductor wafer.

C3. The method of any of paragraphs C1-C2 or the wafer processing system of any of paragraphs C1-C2, wherein the semiconductor wafer includes at least one of a plurality of integrated circuit devices, a plurality of semiconductor devices, a plurality of electronic devices, a plurality of microelectronic mechanical systems, a plurality of optoelectronic devices, and/or a plurality of optical devices.

D1. The use of any of the methods of any of paragraphs A1-A40 or C1-C3 with any of the wafer processing systems of any of paragraphs B1-C3.

D2. The use of any of the wafer processing systems of any of paragraphs B1-C3 with any of the methods of any of paragraphs A1-A40 or C1-C3.

D3. The use of any of the methods of any of paragraphs A1-A40 or C1-C3 or any of the wafer processing systems of any of paragraphs B1-C3 to perform a process operation on a wafer.

D4. The use of any of the methods of any of paragraphs A1-A40 or C1-C3 or any of the wafer processing systems of any of paragraphs B1-C3 to test the operation of an electronic device that is present on a wafer.

D5. The use of any of the methods of any of paragraphs A1-A40 or C1-C3 or any of the wafer processing systems of any of paragraphs B1-C3 to remove a first wafer cassette from a wafer processing system and dock a second wafer cassette on the wafer processing system while a selected wafer from the first wafer cassette is being processed on the wafer processing system.

INDUSTRIAL APPLICABILITY

The systems and methods disclosed herein are applicable to the electronic device development and test industries.

It is believed that the disclosure set forth above encompasses multiple distinct inventions with independent utility. While each of these inventions has been disclosed in its preferred form, the specific embodiments thereof as disclosed and illustrated herein are not to be considered in a limiting sense as numerous variations are possible. The subject matter of the inventions includes all novel and non-obvious combinations and subcombinations of the various elements, features, functions and/or properties disclosed herein. Similarly, when the disclosure, the preceding numbered paragraphs, or subsequently filed claims recite "a" or "a first" element or the equivalent thereof, such claims should be understood to include incorporation of one or more such elements, neither requiring nor excluding two or more such elements.

It is believed that the following claims particularly point out certain combinations and subcombinations that are directed to one of the disclosed inventions and are novel and non-obvious. Inventions embodied in other combinations and subcombinations of features, functions, elements and/or properties may be claimed through amendment of the present claims or presentation of new claims in this or a related application. Such amended or new claims, whether they are directed to a different invention or directed to the same invention, whether different, broader, narrower, or equal in scope to the original claims, are also regarded as included within the subject matter of the inventions of the present disclosure.

The invention claimed is:

1. A method of providing wafer access in a probe system, the method comprising:
   docking a first wafer cassette with a loading port of the probe system, wherein the first wafer cassette includes a plurality of first slots, wherein the plurality of first slots is configured to contain a plurality of wafers, wherein at least one of the plurality of first slots contains a wafer, and further wherein, subsequent to the docking the first wafer cassette, the first wafer cassette is in physical contact with the probe system;
   removing a selected wafer from the first wafer cassette with the probe system;
   subsequent to the removing, performing a process operation on the selected wafer with the probe system, wherein the performing includes testing an operation of at least a portion of the selected wafer;
   undocking the first wafer cassette from the loading port of the probe system subsequent to the removing and during the performing, wherein, subsequent to the undocking, the first wafer cassette is not in physical contact with the probe system;
   subsequent to the undocking, docking a second wafer cassette with the loading port of the probe system;
   inventorying the second wafer cassette with the probe system subsequent to the docking the second wafer cassette; and
   placing the selected wafer in the second wafer cassette subsequent to the performing, the undocking the first wafer cassette, the docking the second wafer cassette, and the inventorying.

2. The method of claim 1, wherein a single wafer cassette comprises both the first wafer cassette and the second wafer cassette.

3. The method of claim 2, wherein, subsequent to the undocking and prior to the docking the second wafer cassette, the method further includes changing a number of wafers in the first wafer cassette, wherein the changing includes at least one of (i) adding at least one added wafer to the first wafer cassette and (ii) removing at least one removed wafer from the first wafer cassette.

4. The method of claim 1, wherein the first wafer cassette is different from the second wafer cassette.

5. The method of claim 1, wherein the process operation is a first process operation, wherein the selected wafer is a first selected wafer, and further wherein, subsequent to the inventorying, the method further includes initializing a second process operation on a second selected wafer with the probe system, wherein the initializing is at least partially concurrent with the performing the first process operation.

6. The method of claim 5, wherein subsequent to the undocking and prior to the docking the second wafer cassette, the method further includes adding at least one added wafer to the first wafer cassette, wherein the second selected wafer is the at least one added wafer.

7. The method of claim 5, wherein the first selected wafer is different from the second selected wafer.

8. The method of claim 5, wherein, subsequent to performing the first process operation on the first selected wafer, the method further includes automatically performing the second process operation on the second selected wafer.

9. The method of claim 1, wherein the undocking includes removing the first wafer cassette from the probe system.

10. The method of claim 1, wherein the second wafer cassette includes a plurality of second slots, wherein each of the plurality of second slots is configured to contain a wafer, and further wherein the inventorying includes determining which of the plurality of second slots contains a wafer.

11. The method of claim 1, wherein the probe system includes an automated controller, and further wherein the method includes:
   regulating the docking the first wafer cassette with the automated controller;
   regulating the removing the selected wafer from the first wafer cassette with the automated controller;
   regulating the performing the process operation on the selected wafer with the automated controller;
   regulating the undocking the first wafer cassette with the automated controller;
   regulating the docking the second wafer cassette with the automated controller;

regulating the inventorying the second wafer cassette with the automated controller; and regulating the placing the selected wafer in the second wafer cassette with the automated controller.

12. A probe system that is configured to test a wafer, the probe system comprising:

a loading port that is configured to receive a wafer cassette;

a wafer detection system that is configured to inventory the wafer cassette;

a process module that is configured to perforin at least one process operation on a selected wafer;

a transfer assembly that is configured to transfer the selected wafer between the wafer cassette and the process module; and an automated controller that is programmed to control the operation of the probe system using the method of claim 1.

13. The probe system of claim 12, wherein the probe system is configured to test a device that is located on the wafer, and further wherein the probe system includes:

a chuck that is configured to receive the wafer from the transfer assembly;

a probe assembly that is configured to contact the device;

a signal generation assembly that is configured to provide a test signal to the device via the probe assembly; and a signal analysis assembly that is configured to receive a resultant signal from the device via the probe assembly.

14. The probe system of claim 13, wherein the probe system includes the selected wafer, and further wherein the selected wafer is a semiconductor wafer.

15. The probe system of claim 14, wherein the semiconductor wafer includes at least one of a plurality of integrated circuit devices, a plurality of semiconductor devices, a plurality of electronic devices, a plurality of microelectronic mechanical systems, a plurality of optoelectronic devices, and a plurality of optical devices.

16. The method of claim 1, wherein the undocking includes undocking while the selected wafer is located within the probe system.

17. A probe system that is configured to test a wafer, the probe system comprising:

a loading port that is configured to receive a wafer cassette;

a wafer detection system that is configured to inventory the wafer cassette;

a process module that is configured to test an operation of at least a portion of a selected wafer;

a transfer assembly that is configured to transfer the selected wafer between the wafer cassette and the process module; and an automated controller that is programmed to:
(i) remove the selected wafer from a first wafer cassette with the transfer assembly;
(ii) test the operation of at least the portion of the selected wafer with the process module; and
(iii) permit the first wafer cassette to be undocked from the loading port and removed from the probe system and permit a second wafer cassette to be docked on the loading port while the process module tests the operation of the selected wafer.

18. The probe system of claim 17, wherein the probe system is configured to test a device that is located on the wafer, and further wherein the probe system includes:

a chuck that is configured to receive the wafer from the transfer assembly;

a probe assembly that is configured to contact the device;

a signal generation assembly that is configured to provide a test signal to the device via the probe assembly; and a signal analysis assembly that is configured to receive a resultant signal from the device via the probe assembly.

19. The probe system of claim 18, wherein the probe system includes the selected wafer, and further wherein the selected wafer is a semiconductor wafer.

20. The probe system of claim 19, wherein the semiconductor wafer includes at least one of a plurality of integrated circuit devices, a plurality of semiconductor devices, a plurality of electronic devices, a plurality of microelectronic mechanical systems, a plurality of optoelectronic devices, and a plurality of optical devices.

* * * * *